(12) United States Patent
Wang et al.

(10) Patent No.: US 10,027,294 B2
(45) Date of Patent: Jul. 17, 2018

(54) CLASS-D AMPLIFIER WITH PULSE-WIDTH MODULATION COMMON-MODE CONTROL AND ASSOCIATED METHOD FOR PERFORMING CLASS-D AMPLIFICATION

(71) Applicant: MEDIATEK INC., Hsin-Chu (TW)

(72) Inventors: Wen-Chieh Wang, Tainan (TW); Yu-Hsin Lin, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/257,939

(22) Filed: Sep. 7, 2016

(65) Prior Publication Data
US 2017/0077882 A1 Mar. 16, 2017

Related U.S. Application Data

(60) Provisional application No. 62/217,178, filed on Sep. 11, 2015, provisional application No. 62/218,744, filed on Sep. 15, 2015.

(51) Int. Cl.
*H03F 3/45* (2006.01)
*H03F 3/185* (2006.01)
(Continued)

(52) U.S. Cl.
CPC ......... *H03F 3/45645* (2013.01); *H03F 1/342* (2013.01); *H03F 3/185* (2013.01);
(Continued)

(58) Field of Classification Search
CPC ...... H03F 3/217; H03F 3/2171; H03F 3/2173; H03F 3/38; H03F 2200/432; H03F 1/04; H03F 1/34
(Continued)

(56) References Cited

U.S. PATENT DOCUMENTS

| 7,772,924 B2 * | 8/2010 | Matamura | H03F 3/2173 330/10 |
| 8,558,609 B2 * | 10/2013 | Fang | H03K 7/08 327/316 |

(Continued)

FOREIGN PATENT DOCUMENTS

CN 102832887 A 12/2012

OTHER PUBLICATIONS

Choi, A 0.018% THD+N, 88-dB PSRR PWM Class-D Amplifier for Direct Battery Hookup, IEEE Journal of Solid-State Circuits, vol. 47, No. 2, pp. 454-463, Feb. 2012.

(Continued)

*Primary Examiner* — Khanh V Nguyen
(74) *Attorney, Agent, or Firm* — Winston Hsu

(57) ABSTRACT

A class-D amplifier includes a loop filter, a pulse-width modulation (PWM) circuit, an output circuit, and a common-mode control circuit. The loop filter receives an input signal of the class-D amplifier to generate a filtered signal. The PWM circuit converts a non-PWM signal into a PWM signal, wherein the non-PWM signal is derived from at least the filtered signal. The output circuit generates an output signal of the class-D amplifier according to the PWM signal. The common-mode control circuit monitors a common-mode level of the output signal to generate a common-mode control signal for PWM common-mode control.

20 Claims, 13 Drawing Sheets

(51) Int. Cl.
*H03F 3/217* (2006.01)
*H03F 1/34* (2006.01)

(52) U.S. Cl.
CPC ........... *H03F 3/217* (2013.01); *H03F 3/2171* (2013.01); *H03F 3/45479* (2013.01); *H03F 1/34* (2013.01); *H03F 3/2173* (2013.01); *H03F 2200/165* (2013.01); *H03F 2200/351* (2013.01); *H03F 2200/555* (2013.01); *H03F 2203/45418* (2013.01); *H03F 2203/45424* (2013.01); *H03F 2203/45434* (2013.01); *H03F 2203/45438* (2013.01); *H03F 2203/45441* (2013.01)

(58) Field of Classification Search
USPC ........................................ 330/10, 207 A, 251
See application file for complete search history.

(56) References Cited

U.S. PATENT DOCUMENTS

| | | | |
|---|---|---|---|
| 2004/0232978 A1* | 11/2004 | Easson | H03F 3/2173 330/10 |
| 2010/0073063 A1 | 3/2010 | Lakshmikumar | |
| 2013/0127531 A1* | 5/2013 | Lesso | H03F 3/217 330/251 |
| 2017/0019078 A1* | 1/2017 | Galal | H03F 3/45076 |

OTHER PUBLICATIONS

Guo, A 101 dB PSRR, 0.0027% THD+N and 94% Power-Efficiency Filterless Class D Amplifier, IEEE Journal of Solid-State Circuits, vol. 49, No. 11, pp. 2608-2617, Nov. 2014.

Chen, A High-PSRR Reconfigurable Class-AB/D Audio Amplifier Driving a Hands-Free/Receiver 2-in-1 Loudspeaker, IEEE Journal of Solid-State Circuits, vol. 47, No. 11, pp. 2586-2603, Nov. 2012.

Teplechuk, Filterless Integrated Class-D Audio Amplifier Achieving 0.0012% THD+N and 96dB PSRR When Supplying 1.2W, ISSCC 2011/Session 13/Analog Techniques/ 13.3, pp. 240-241 and a page including Figure 13.3.7.

Teplechuk, True Filterless Class-D Audio Amplifier, IEEE Journal of Solid-State Circuits, vol. 46, No. 12, pp. 2784-2793, Dec. 2011.

Jiang, Integrated Class-D Audio Amplifier With 95% Efficiency and 105 dB SNR, IEEE Journal of Solid-State Circuits, vol. 49, No. 11, pp. 2387-2396, Nov. 2014.

* cited by examiner

CLASS-D AMPLIFIER WITH PULSE-WIDTH MODULATION COMMON-MODE CONTROL AND ASSOCIATED METHOD FOR PERFORMING CLASS-D AMPLIFICATION

CROSS REFERENCE TO RELATED APPLICATIONS

This application claims the benefit of U.S. provisional application No. 62/217,178 filed on Sep. 11, 2015 and U.S. provisional application No. 62/218,744 filed on Sep. 15, 2015. The entire contents of the related U.S. provisional applications are incorporated herein by reference.

BACKGROUND

The present invention relates to an amplifier design, and more particularly, to a class-D amplifier with pulse-width modulation (PWM) common-mode control and an associated method for performing class-D amplification.

A class-D amplifier is basically a switching amplifier. It has a power efficiency approaching 100%. That is, most of the power supplied to the class-D amplifier is delivered to the load. Conventionally, a low-dropout (LDO) regulator with high power supply rejection ratio (PSRR) is adopted to supply a clean power to the class-D amplifier. This LDO is used to mitigate the noise coupling through or generated from the power management circuit that may include buck/boost converters. However, this LDO causes additional power loss and decreases the energy efficiency of the whole system. Therefore, in order to avoid this undesired power loss, the supply voltage of a class-D amplifier is preferred to be powered by a power source (e.g., a battery) without using a LDO, which lays critical emphasis on the PSRR of the Class-D audio amplifier. Consequently, for high performance of audio applications, there is a need for an innovative class-D amplifier (CDA) design with high power-supply rejection ratio (PSRR) and high linearity (e.g., low Total Harmonic Distortion with Noise (THD+N)).

SUMMARY

One of the objectives of the claimed invention is to provide a class-D amplifier with pulse-width modulation (PWM) common-mode control and an associated method for performing class-D amplification.

According to a first aspect of the present invention, an exemplary class-D amplifier is disclosed. The exemplary class-D amplifier includes a loop filter, a pulse-width modulation (PWM) circuit, an output circuit, and a common-mode control circuit. The loop filter is arranged to receive an input signal of the class-D amplifier to generate a filtered signal. The PWM circuit is arranged to convert a non-PWM signal into a PWM signal, wherein the non-PWM signal is derived from at least the filtered signal. The output circuit is arranged to generate an output signal of the class-D amplifier according to the PWM signal. The common-mode control circuit is arranged to monitor a common-mode level of the output signal to generate a common-mode control signal for PWM common-mode control.

According to a second aspect of the present invention, an exemplary class-D amplifier is disclosed. The exemplary class-D amplifier includes a loop filter, a combining circuit, an input feed-forward circuit, a pulse-width modulation (PWM) circuit, and an output circuit. The loop filter is arranged to receive an input signal of the class-D amplifier to generate a filtered signal. The combining circuit is arranged to combine at least the filtered signal and the input signal to generate a non-PWM signal, wherein the combining circuit is composed of passive components only. The input feed-forward circuit is arranged to feed the input signal to the combining circuit. The PWM circuit is arranged to convert the non-PWM signal into a PWM signal. The output circuit is arranged to generate an output signal of the class-D amplifier according to the PWM signal.

According to a third aspect of the present invention, an exemplary method for performing class-D amplification is disclosed. The exemplary method includes: performing a loop filtering operation upon an input signal of the class-D amplification to generate a filtered signal; performing a pulse-width modulation (PWM) operation to convert a non-PWM signal into a PWM signal, wherein the non-PWM signal is derived from at least the filtered signal; generating an output signal of the class-D amplification according to the PWM signal; and monitoring a common-mode level of the output signal to generate a common-mode control signal for PWM common-mode control.

According to a fourth aspect of the present invention, an exemplary method for performing class-D amplification is disclosed. The exemplary method includes: performing a loop filtering operation upon an input signal of the class-D amplification to generate a filtered signal; utilizing a combining circuit to combine at least the filtered signal and the input signal to generate a non-PWM signal, wherein the combining circuit is composed of passive components only; performing a pulse-width modulation (PWM) operation to convert the non-PWM signal into a PWM signal; and generating an output signal of the class-D amplifier according to the PWM signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
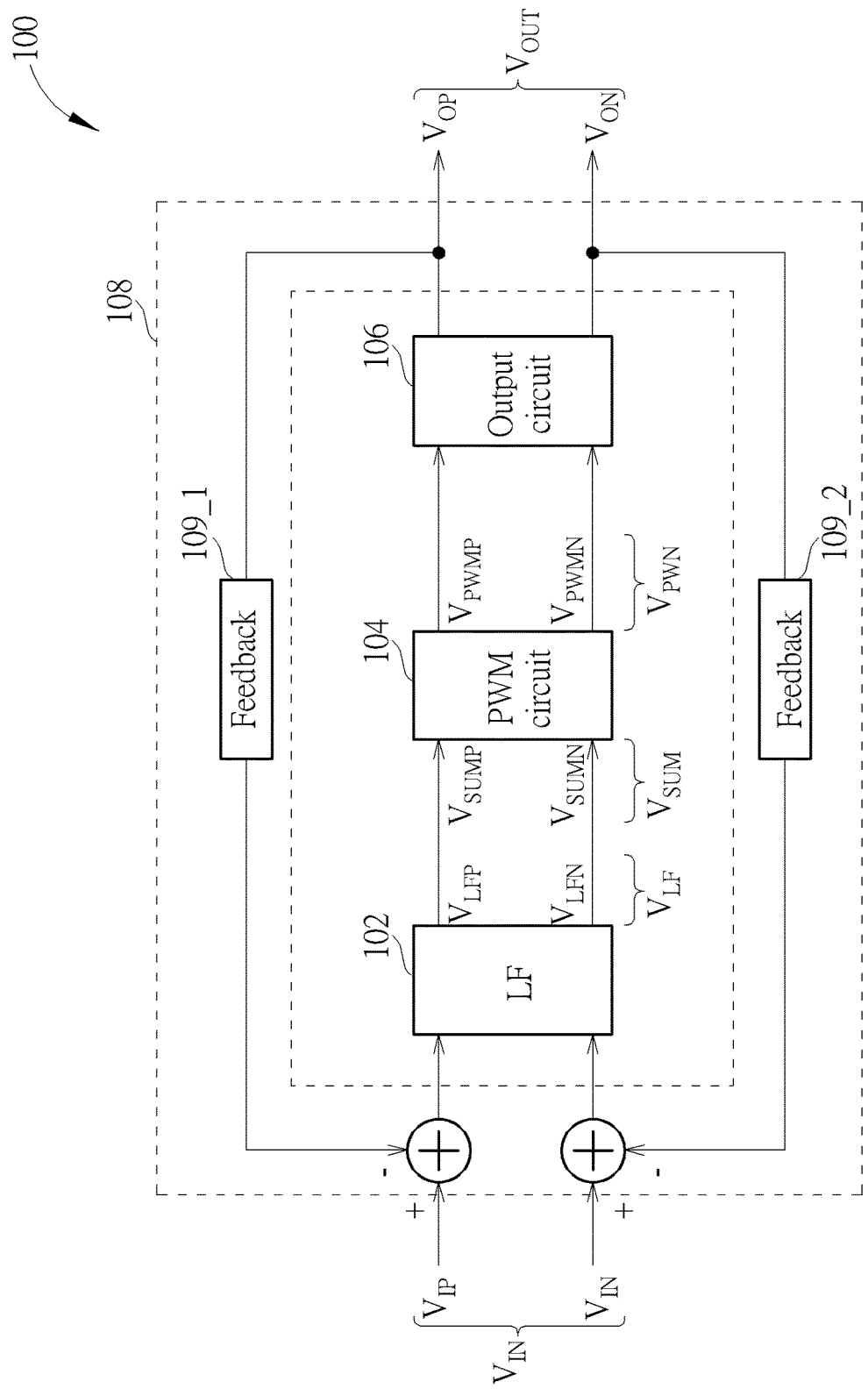
FIG. 1 is a diagram illustrating a class-D amplifier without proposed pulse-width modulation (PWM) common-mode control according to an embodiment of the present invention.

FIG. 1 is a diagram illustrating a class-D amplifier without proposed pulse-width modulation (PWM) common-mode control according to an embodiment of the present invention. The class-D amplifier 100 may be a fully-differential closed-loop class-D amplifier, including a loop filter (denoted by "LF") 102, a PWM circuit 104, an output circuit 106, and a feedback circuit 108. The loop filter 102 is arranged to receive an input signal $V_{IN}$ of the class-D amplifier 100 to generate a filtered signal $V_{LF}$, wherein the input signal $V_{IN}$ is a fully-differential signal composed of a positive signal $V_{IP}$ and a negative signal $V_{IN}$, and the filtered signal $V_{LF}$ is a fully-differential signal composed of a positive signal $V_{LFP}$ and a negative signal $V_{LFN}$. The PWM circuit 104 is arranged to convert a non-PWM signal $V_{SUM}$ into a PWM signal $V_{PWM}$. The non-PWM signal $V_{SUM}$ may be derived from the filtered signal $V_{LF}$, directly or indirectly. For example, the filtered signal $V_{LF}$ may be directly fed into the PWM circuit 104 to serve as the non-PWM signal $V_{SUM}$. For another example, the filtered signal $V_{LF}$ may be processed (e.g., combined with an input feed-forward signal) before being fed into the PWM circuit 104. The non-PWM signal $V_{sum}$ is composed of a positive signal $V_{SUMP}$ and a negative signal $V_{SUMN}$, and the PWM signal $V_{PWM}$ is composed of a positive signal $V_{PWMP}$ and a negative signal $V_{PWMN}$. The output circuit 106 is arranged to generate an output signal $V_{OUT}$ of the class-D amplifier 100 according to the PWM signal $V_{PWM}$, where the output signal $V_{OUT}$ is composed of a positive signal $V_{OP}$ and a negative signal $V_{ON}$. For example, the output circuit 106 may include a non-overlapping clock generator and an H-bridge output driver. The feedback circuit 108 is coupled between an output of the output circuit 106 and an input of the loop filter 102, and includes a plurality of feedback paths (e.g., feedback resistors) 109_1 and 109_2. In an actual implementation, the feedback paths 109_1 and 109_2 have a gain mismatch δ, thus resulting in undesired terms (e.g., distortions and noise) in the differential output ($V_{OP}$-$V_{ON}$).

Figure 2:
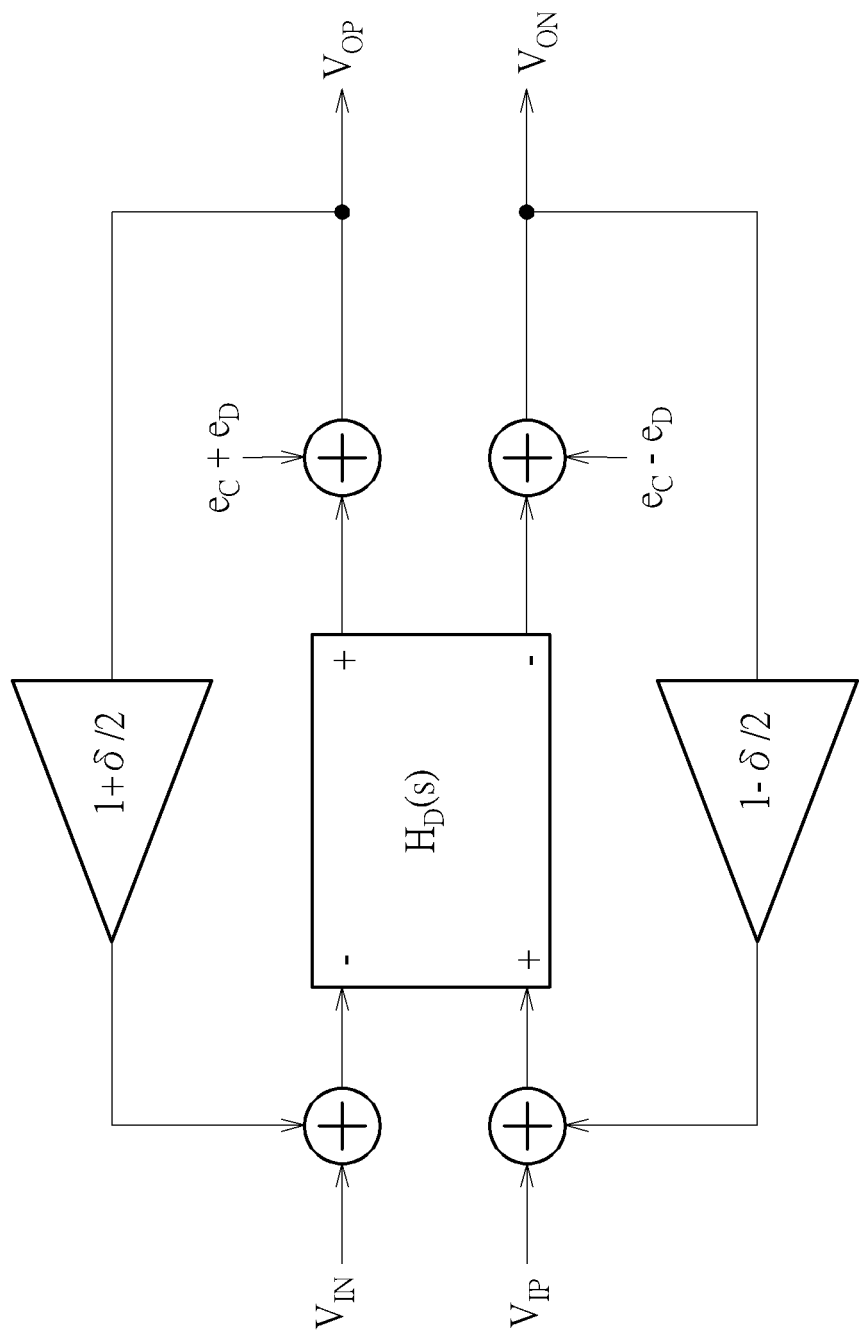
FIG. 2 is a diagram illustrating a linear model of the class-D amplifier in FIG. 1 according to an embodiment of the present invention.

FIG. 2 is a diagram illustrating a linear model of the class-D amplifier 100 in FIG. 1 according to an embodiment of the present invention. The class-D amplifier 100 can be linearly modeled because the PWM switching frequency is much higher than the signal bandwidth. The supply noise and/or the even harmonic distortions may be represented by $e_C$. The differential noise and/or the odd harmonic distortions may be represented by $e_D$. The loop gain of the class-D amplifier 100 may be represented by $H_D(s)$. The differential output ($V_{OP}$-$V_{ON}$) may be expressed using the following formula.

$$(V_{OP} - V_{ON}) \approx (V_{IP} - V_{IN}) - \delta \times e_C + \frac{2e_D}{H_D}, \text{ where } H_D \gg 1 \qquad (1)$$

With the gain mismatch δ of the differential feedback path, the supply noise and/or the even harmonic distortions $e_C$ contribute $\delta \times e_C$ to the differential output ($V_{OP}$-$V_{ON}$). The differential noise and/or the odd harmonic distortions $e_D$ can be suppressed by the loop gain $H_D(s)$. PSRR can only be improved by reducing the gain mismatch δ. For example, a stringent matching requirement of δ<0.001% is required in order to achieve PSRR>100 dB. However, it is very hard to meet the stringent matching requirement of δ<0.001% in the real world. The present invention therefore proposes applying PWM common-mode (CM) control to a class-D amplifier to suppress the supply noise and/or the even harmonic distortions at the class-D amplifier output $\delta \times e_C$.

Figure 3:
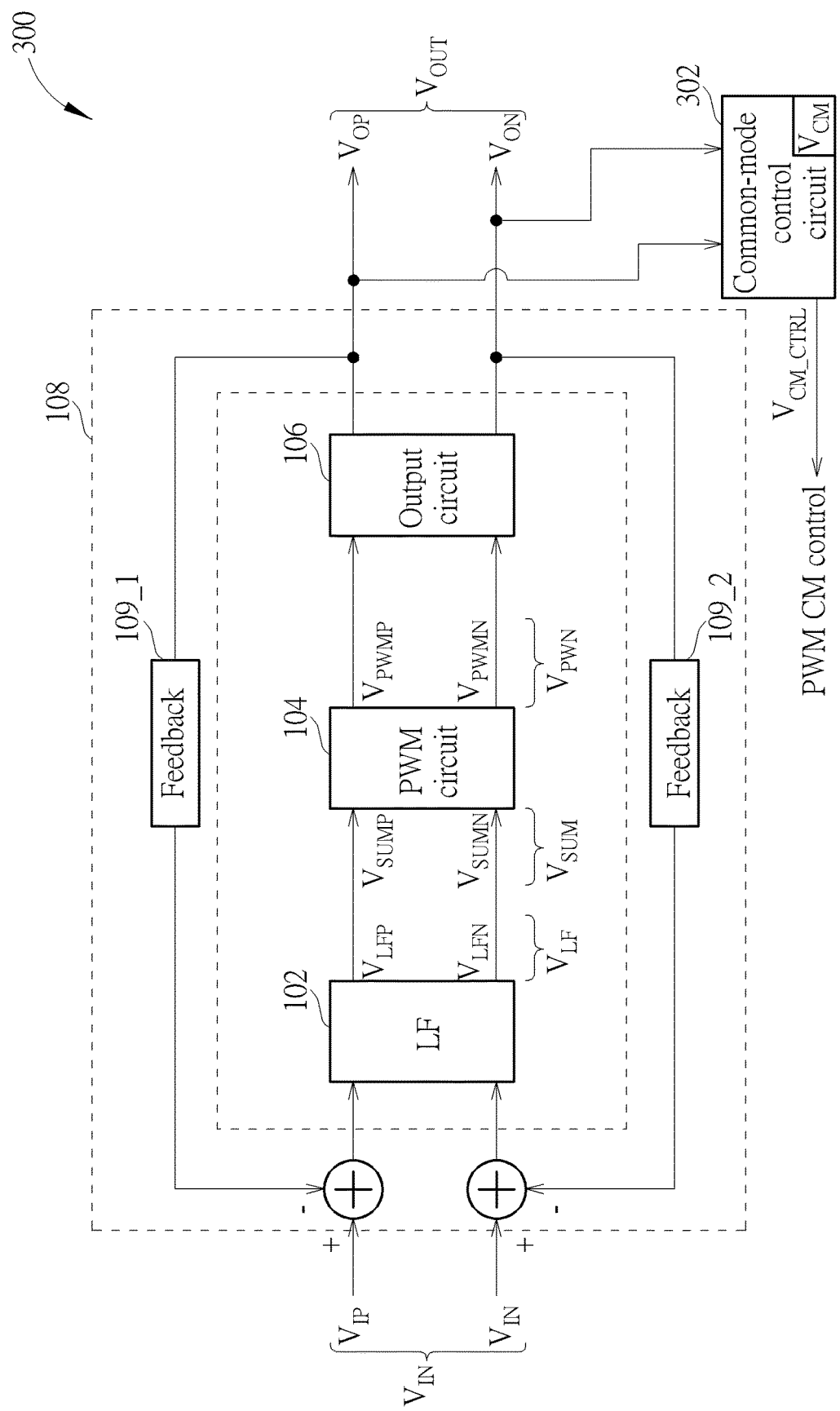
FIG. 3 is a diagram illustrating a class-D amplifier with proposed PWM common-mode control according to an embodiment of the present invention.

FIG. 3 is a diagram illustrating a class-D amplifier with proposed PWM common-mode control according to an embodiment of the present invention. The class-D amplifier 300 may be a fully-differential closed-loop class-D amplifier, including a common-mode control circuit 302 and the aforementioned loop filter 102, PWM circuit 104, output circuit 106 and feedback circuit 108. That is, the class-D amplifier 300 shown in FIG. 3 may be created by adding the common-mode control circuit 302 to the class-D amplifier 100 shown in FIG. 1. In this embodiment, the common-mode control circuit 302 is arranged to monitor a common-mode level of the output signal $V_{OUT}$ (which is composed of the positive signal $V_{OP}$ and the negative signal $V_{ON}$) to generate a common-mode control signal $V_{CM\_CTRL}$ for PWM common-mode (CM) control. For example, the common-mode level of the output signal $V_{OUT}$ is compared with a reference common-mode voltage $V_{CM}$ to set the common-mode control signal $V_{CM\_CTRL}$.

Figure 4:
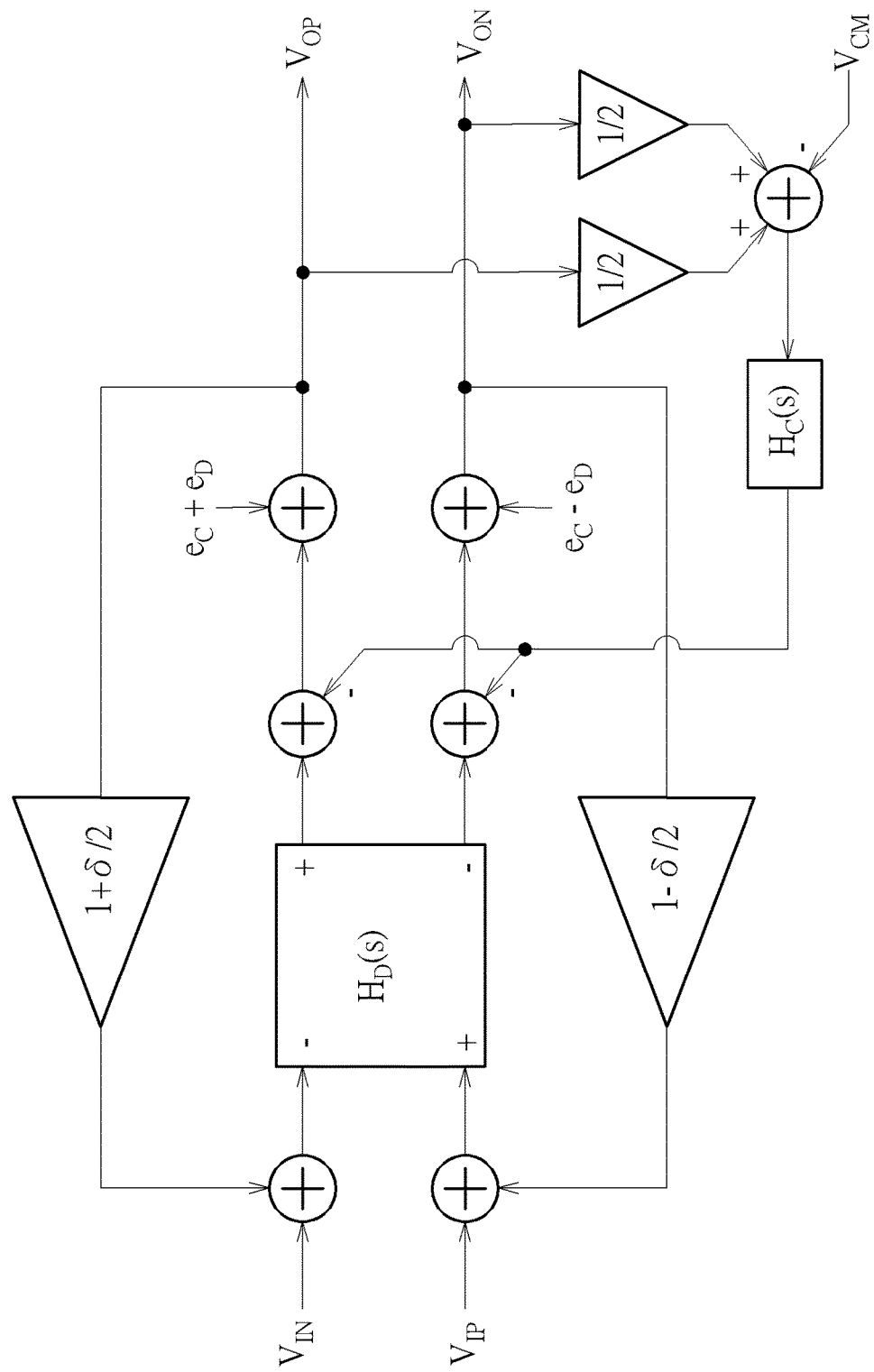
FIG. 4 is a diagram illustrating a linear model of the class-D amplifier in FIG. 3 according to an embodiment of the present invention.

FIG. 4 is a diagram illustrating a linear model of the class-D amplifier 300 in FIG. 3 according to an embodiment of the present invention. The class-D amplifier 300 can be linearly modeled because the PWM switching frequency is much higher than the signal bandwidth. The supply noise and/or the even harmonic distortions may be represented by $e_C$. The differential noise and/or the odd harmonic distortions may be represented by $e_D$). The loop gain of the class-D amplifier 300 may be represented by $H_D(s)$. The PWM common-mode control loop provided by the common-mode control circuit 302 is capable of further suppressing the supply noise and/or the even harmonic distortions at the class-D amplifier output $\delta \times e_C$. The loop gain of the PWM common-mode control loop may be represented by $H_C(s)$. The differential output ($V_{OP}$-$V_{ON}$) may be expressed using the following formula.

$$(V_{OP} - V_{ON}) \approx (V_{IP} - V_{IN}) - \delta \times \frac{e_C}{H_C} + \frac{2e_D}{H_D} - \delta \times V_{CM}, \qquad (2)$$

$$\text{where } H_D \gg 1 \text{ and } H_c \gg 1$$

The above derivation shows that the supply noise and/or the even harmonic distortions $e_C$ are further suppressed by the loop gain $H_C(s)$ of the PWM common-mode control loop. Hence, the supply noise and/or the even harmonic distortions at the class-D amplifier output can be improved from $$\delta \times e_C \text{ to } \delta \times \frac{e_C}{H_C}.$$

The matching requirement of the differential feedback path can be relaxed by the introduced PWM common-mode control loop. To put it simply, the proposed PWM common-mode control loop is of great help to improve the PSRR and reduce the THD+N of the fully-differential closed-loop class-D amplifier. With the gain mismatch $\delta$ of the differential feedback path, the reference common-mode voltage $V_{CM}$ contributes $\delta \times V_{CM}$ to the differential output ($V_{OP}$-$V_{ON}$). In one exemplary design, a high PSRR bandgap reference voltage generator may be used to provide a bandgap reference voltage for setting the reference common-mode voltage $V_{CM}$, thereby mitigating or avoiding the noise caused by the reference common-mode voltage $V_{CM}$ at the class-D amplifier output.

Figure 5:
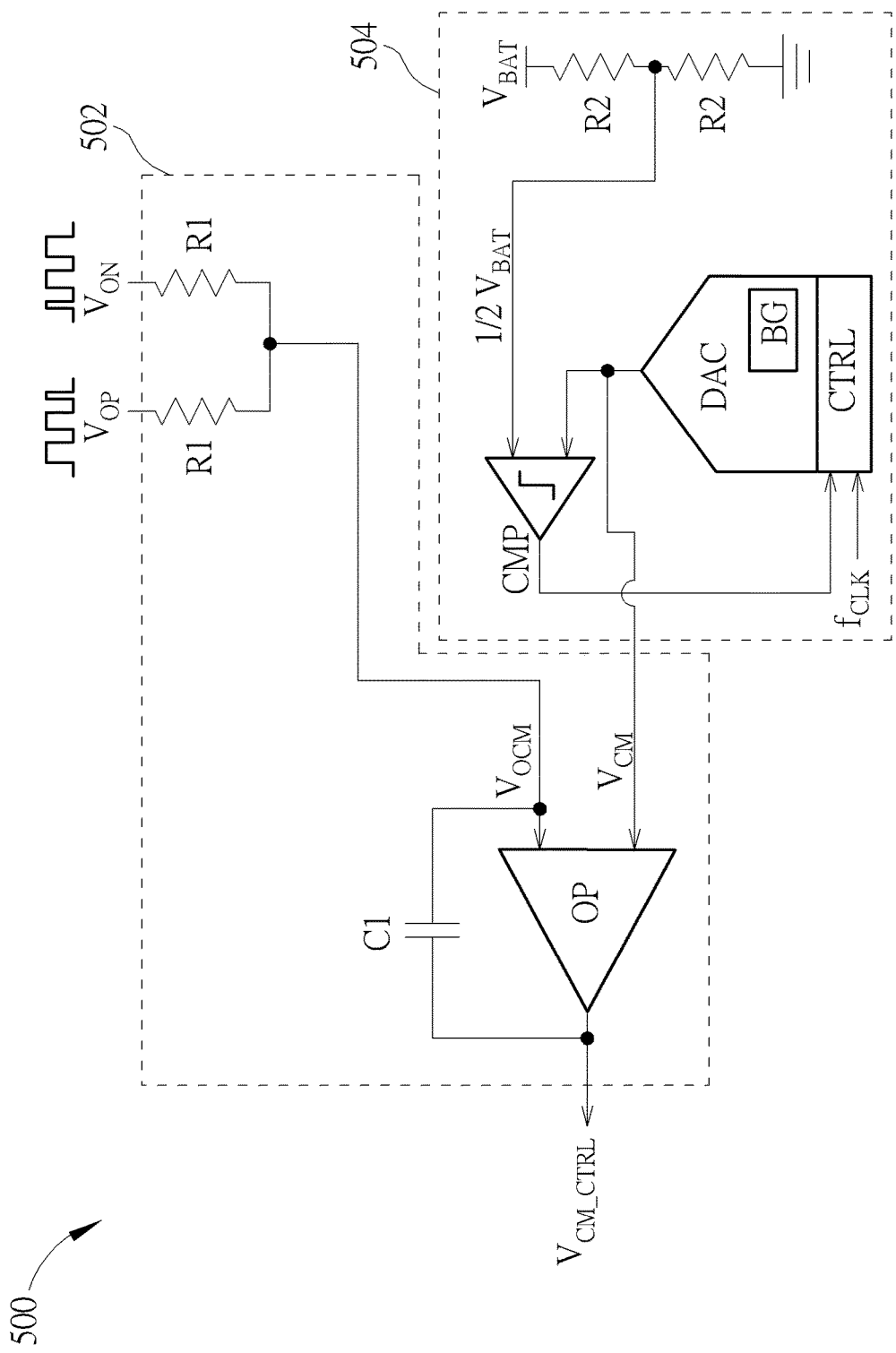
FIG. 5 is a diagram illustrating a common-mode control circuit according to an embodiment of the present invention.

FIG. 5 is a diagram illustrating a common-mode control circuit according to an embodiment of the present invention. For example, the common-mode control circuit 302 shown in FIG. 3 may be implemented using the common-mode control circuit 500 shown in FIG. 5. The common-mode control circuit 500 includes an operational amplifier circuit 502 and a reference common-mode voltage generator 504. In this embodiment, the operational amplifier circuit 502 is realized by a $1^{st}$-order active-RC integrator that includes an operational amplifier OP, a capacitor C1, and a plurality of resistors R1. The operational amplifier circuit 502 senses an average of the class-D amplifier output (i.e., a common-mode voltage $V_{OCM}$ of the positive signal $V_{OP}$ and the negative signal $V_{ON}$), and compares the sensed common-mode voltage $V_{OCM}$ with the reference common-mode voltage $V_{CM}$ to output the common-mode control signal $V_{CM\_CTRL}$ for PWM common-mode control. In one exemplary embodiment, the PWM circuit 104 and the output circuit 106 both obtain the supply voltage $V_{BAT}$ from a battery (not shown) directly. Hence, the reference common-mode voltage $V_{CM}$ may be set by $\frac{1}{2}V_{BAT}$ to enlarge the output swing. As shown in FIG. 5, the reference common-mode voltage generator 504 includes a plurality of circuits, such as a voltage divider, a comparator, and a digital-to-analog converter. The voltage divider is implemented by resistors R2 for dividing the supply voltage $V_{BAT}$ that is directly provided by the battery. The comparator CMP is arranged to compare a voltage output $\frac{1}{2}V_{BAT}$ of the voltage divider and a voltage output $V_{CM}$ of the digital-to-analog converter DAC, and generate a comparison result to a control circuit CTRL of the digital-to-analog converter DAC. The digital-to-analog converter DAC may be a low-rate digital-to-analog converter that operates under a low-frequency clock signal $f_{CLK}$ (e.g., $f_{CLK} \ll 217$ Hz) and has a high PSRR bandgap reference voltage generator BG arranged to provide a bandgap reference voltage. The digital-to-analog converter DAC provides a voltage output (i.e., reference common-mode voltage $V_{CM}$) according to the bandgap reference voltage. That is, the reference common-mode voltage $V_{CM}$ is set by the bandgap reference voltage under the control of the comparison result generated from the comparator CMP. Specifically, the control circuit CTRL refers to the comparison result generated from the comparator CMP to dynamically adjust the reference common-mode voltage $V_{CM}$. In this way, $V_{CM}=\frac{1}{2}V_{BAT}$.

Figure 6:
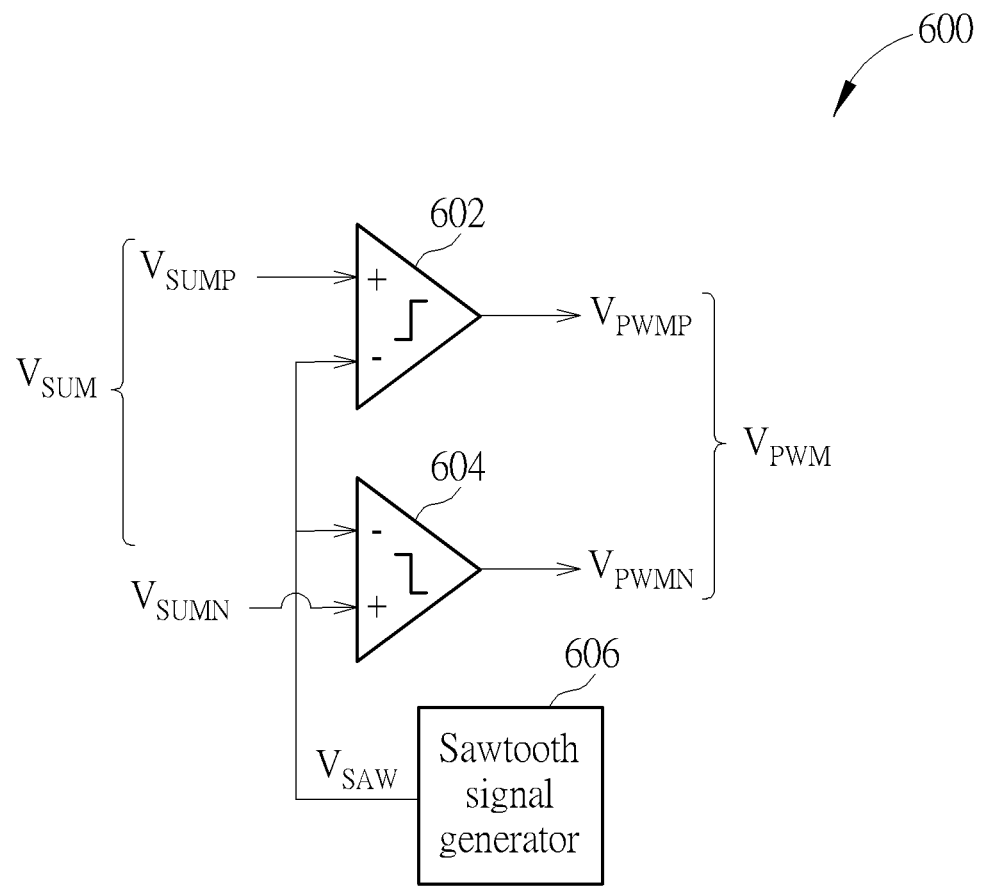
FIG. 6 is a diagram illustrating a PWM circuit according to an embodiment of the present invention.
Figure 7:
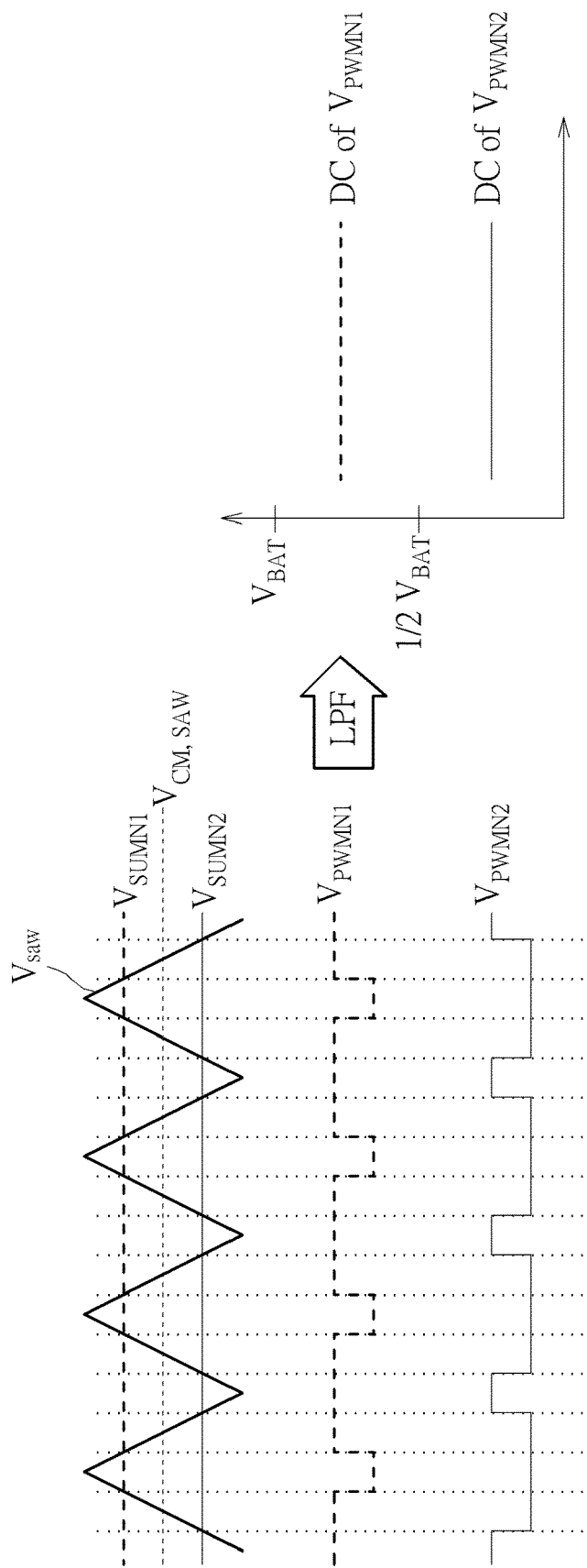
FIG. 7 is a diagram illustrating a PWM operation performed by the PWM circuit in FIG. 6 according to an embodiment of the present invention.

The proposed PWM common-mode control is implemented to control the common-mode level of the PWM signal $V_{PWM}$ (which is composed of the positive signal $V_{PWMP}$ and the negative signal $V_{PWMN}$) generated from the PWM circuit 104 to the output circuit 106. The PWM circuit 104 is used to convert the non-PWM signal $V_{SUM}$ (which is composed of the positive signal $V_{SUMP}$ and the negative signal $V_{SUMN}$) into the PWM signal $V_{PWM}$ (which is composed of the positive signal $V_{PWMP}$ and the negative signal $V_{PWMN}$). FIG. 6 is a diagram illustrating a PWM circuit according to an embodiment of the present invention. The PWM circuit 104 shown in FIG. 3 may be implemented using the PWM circuit 600 shown in FIG. 6. The PWM circuit 600 includes a comparing circuit (e.g., two comparators 602 and 604) and a sawtooth signal generator (or triangular wave generator) 606. The sawtooth signal generator 606 is a circuit designed for generating a sawtooth signal $V_{SAW}$ to each of the comparators 602 and 604. The comparator 602 is arranged to compare the positive signal $V_{SUMP}$ of the non-PWM signal $V_{SUM}$ with the sawtooth signal $V_{SAW}$ to generate the positive signal $V_{PWMP}$ of the PWM signal $V_{PWM}$. The comparator 604 is arranged to compare the negative signal $V_{SUMN}$ of the non-PWM signal $V_{SUM}$ with the sawtooth signal $V_{SAW}$ to generate the negative signal $V_{PWMN}$ of the PWM signal $V_{PWM}$. FIG. 7 is a diagram illustrating a PWM operation performed by the PWM circuit 600 in FIG. 6 according to an embodiment of the present invention. Take the generation of the negative signal $V_{PWMN}$ for example. Assume $V_{CM,SAW}$ is the common-mode level of the sawtooth signal $V_{SAW}$ (i.e., the mid-point of the peak to peak voltage of the sawtooth signal $V_{SAW}$). In a case where the negative signal $V_{PWMN}$ is set by the fixed voltage level $V_{SUMN1}$, a negative signal $V_{PWMN1}$ is generated by comparing the sawtooth signal $V_{SAW}$ with the fixed voltage level $V_{SUMN1}$. In another case where the negative signal $V_{PWMN}$ is set by the fixed voltage level $V_{SUMN2}$, a negative signal $V_{PWMN2}$ is generated by comparing the sawtooth signal $V_{SAW}$ with the fixed voltage level $V_{SUMN2}$. Since the fixed voltage level $V_{SUMN2}$ is lower than the fixed voltage level $V_{SUMN1}$, the duty cycle of the negative signal $V_{PWMN1}$ is larger than the duty cycle of the negative signal $V_{PWMN2}$. Hence, the DC level of the negative signal $V_{PWMN1}$ is higher than the DC level of the negative signal $V_{PWMN2}$. As can be seen from FIG. 7, a common-mode level (DC level) of a PWM signal can be adjusted by adjusting magnitude of a non-PWM signal to be processed by pulse-width modulation. Hence, the common-mode level (DC level) of the PWM signal $V_{PWM}$ is affected by the common-mode level of the non-PWM signal $V_{SUM}$.

The non-PWM signal $V_{SUM}$ (which is composed of the positive signal $V_{SUMP}$ and the negative signal $V_{SUMN}$) is derived from the filtered signal $V_{LF}$ (which is composed of the positive signal $V_{LFP}$ and the negative signal $V_{LFN}$). That is, the non-PWM signal $V_{SUM}$ may be set by the filtered signal $V_{LF}$, directly or indirectly. Hence, the common-mode level of the non-PWM signal $V_{SUM}$ is affected by the common-mode level of the filtered signal $V_{LF}$. Accordingly, the common-mode level (DC level) of the PWM signal $V_{PWM}$ is affected by the common-mode level of the filtered signal $V_{LF}$.

In a first exemplary PWM common-mode control design, the proposed common-mode control circuit 302 is configured to generate the common-mode control signal $V_{CM\_CTRL}$ to the loop filter 102 so as to adjust the common-mode level of the filtered signal $V_{LF}$ for achieving PWM common-mode control. The loop filter 102 may include one or more integrators for performing the loop filtering operation. For example, the loop filter 102 may be implemented by a $3^{rd}$-order loop filter having a $1^{st}$-order integrator and a $2^{nd}$-order integrator that is cascaded to the $1^{st}$-order integrator. In one exemplary implementation, the $1^{st}$-order integrator may be a $1^{st}$-order active-RC integrator, and the $2^{nd}$-order integrator may be a $2^{nd}$-order filter that adopts the single-amplifier-biquad technique to save one operational amplifier and its associated power consumption. Since the $2^{nd}$-order integrator is the last one of cascaded integrators in the loop filter, the $2^{nd}$-order integrator (particularly, the single operational amplifier of the $2^{nd}$-order integrator) is responsible for generating the filtered signal $V_{LF}$ (which is composed of the positive signal $V_{LFP}$ and the negative signal $V_{LFN}$). The single operational amplifier of the $2^{nd}$-order integrator may be configured to have a common-mode feedback (CMFB) circuit that is responsive to the common-mode control signal $V_{CM\_CTRL}$ for PWM common-mode control.

Figure 8:
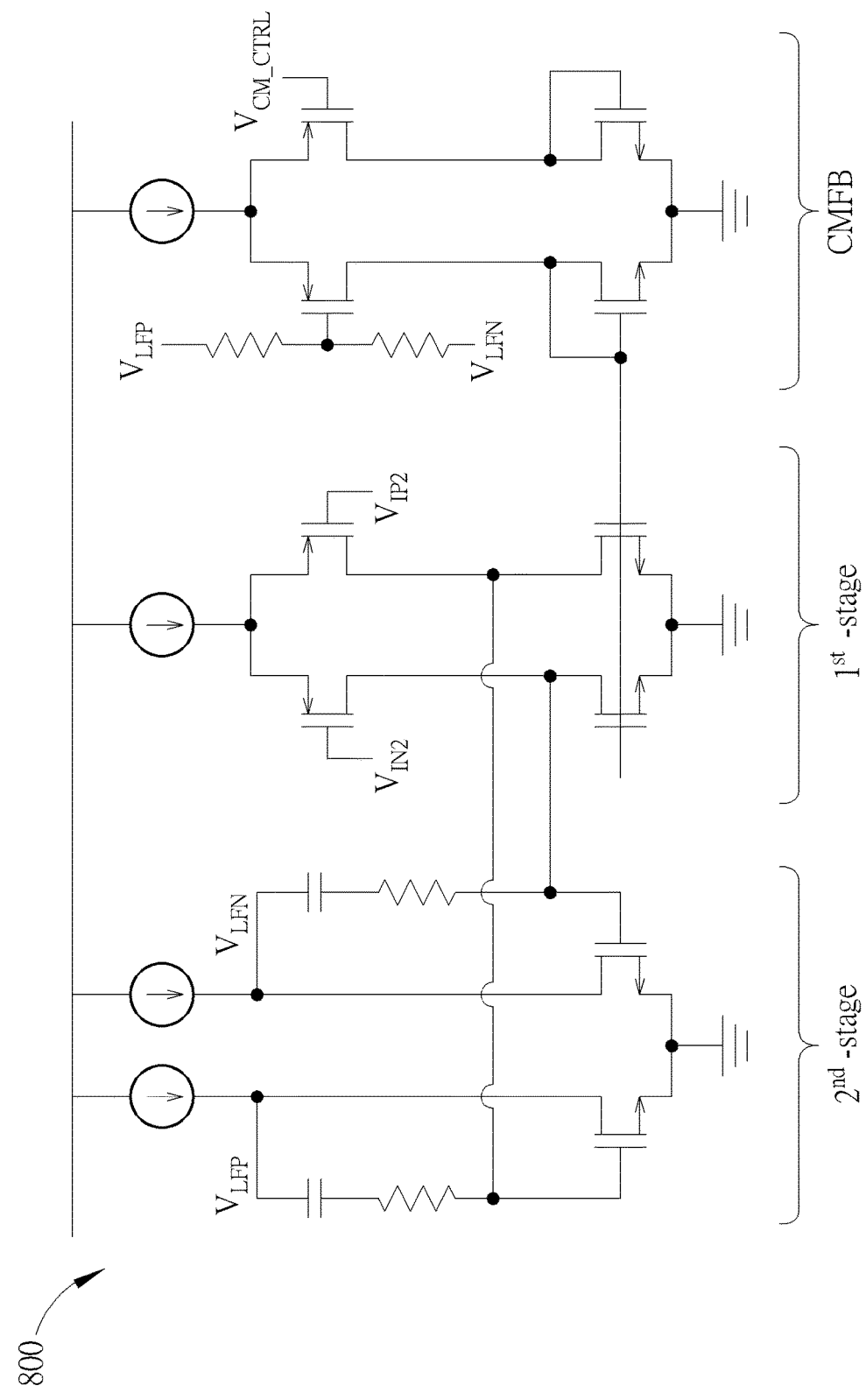
FIG. 8 is a diagram illustrating an operational amplifier used for generating a filtered signal of a loop filter according to an embodiment of the present invention.

FIG. 8 is a diagram illustrating an operational amplifier used for generating a filtered signal of a loop filter according to an embodiment of the present invention. The operational amplifier 800 may be the aforementioned single operational amplifier of the $2^{nd}$-order integrator that adopts the single-amplifier-biquad technique. As shown in FIG. 8, the operational amplifier 800 includes a $1^{st}$-stage circuit, a $2^{nd}$-stage circuit, and a CMFB circuit. The $1^{st}$-stage circuit receives an input signal ($V_{IP2}$, $V_{IN2}$) from a preceding circuit (e.g., an output signal of the $1^{st}$-order integrator in the loop filter). The $2^{nd}$-stage circuit generates and outputs the positive signal $V_{LFP}$ and the negative signal $V_{LFN}$ of the filtered signal $V_{LF}$. The common-mode level of the filtered signal $V_{LF}$ generated from the $2^{nd}$-stage circuit is controlled by the CMFB circuit. In this embodiment, the CMFB circuit receives the common-mode control signal $V_{CM\_CTRL}$ from the common-mode control circuit 302, and adaptively adjusts the common-mode level of the filtered signal $V_{LF}$ according to the common-mode control signal $V_{CM\_CTRL}$.

As mentioned above, the non-PWM signal $V_{SUM}$ (which is composed of the positive signal $V_{SUMP}$ and the negative signal $V_{SUMN}$) is derived from the filtered signal $V_{LF}$ (which is composed of the positive signal $V_{LFP}$ and the negative signal $V_{LFN}$), and the common-mode level of the PWM signal $V_{PWM}$ is affected by the common-mode level of the non-PWM signal $V_{SUM}$. In a second exemplary PWM common-mode control design, the proposed common-mode control circuit 302 is configured to generate the common-mode control signal $V_{CM\_CTRL}$ to a combining circuit located between the loop filter 102 and the PWM circuit 104 so as to adjust the common-mode level of the non-PWM signal $V_{SUM}$ for achieving PWM common-mode control.

Figure 9:
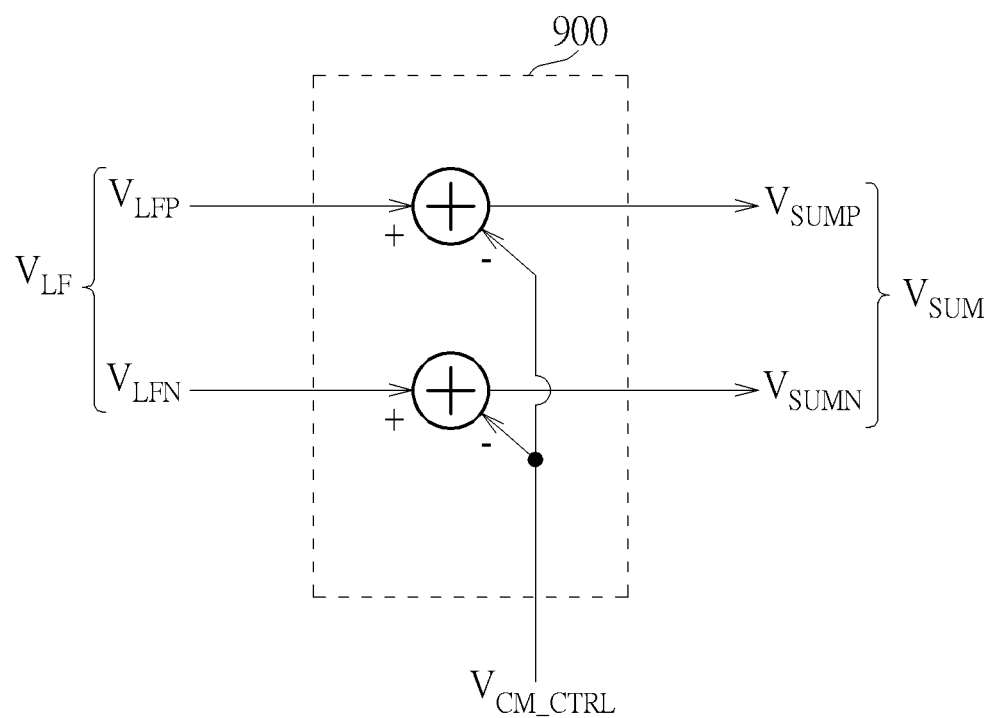
FIG. 9 is a diagram illustrating a combining circuit located between a loop filter and a PWM circuit according to an embodiment of the present invention.

FIG. 9 is a diagram illustrating a combining circuit located between a loop filter and a PWM circuit according to an embodiment of the present invention. For example, the class-D amplifier 300 shown in FIG. 3 may have the combining circuit 900 located between an output of the loop filter 102 and an input of the PWM circuit 104. In this embodiment, the combining circuit 900 receives the common-mode control signal $V_{CM\_CTRL}$ from the common-mode control circuit 302, and combines the filtered signal $V_{LF}$ (which is composed of the positive signal $V_{LFP}$ and the negative signal $V_{LFN}$) and the common-mode control signal $V_{CM\_CTRL}$ to generate the non-PWM signal $V_{SUM}$ (which is composed of the positive signal $V_{SUMP}$ and the negative signal $V_{SUMN}$), such that the common-mode level of the non-PWM signal $V_{SUM}$ is adjusted/shifted by the injected common-mode control signal $V_{CM\_CTRL}$.

As illustrated in FIG. 6, the PWM circuit 600 compares the positive signal $V_{SUMP}$ and the negative signal $V_{SUMN}$ of the non-PWM signal $V_{SUM}$ with the sawtooth signal $V_{SAW}$ to generate the positive signal $V_{PWMP}$ and the negative signal $V_{PWMM}$ of the PWM signal $V_{PWM}$, respectively. In above exemplary designs, the common-mode level of the PWM signal $V_{PWM}$ is adjusted by adjusting the common-mode level of the non-PWM signal $V_{SUM}$, directly or indirectly. Since the sawtooth signal $V_{SAW}$ is also involved in generating the PWM signal $V_{PWM}$, the same objective of adjusting the common-mode level of the PWM signal $V_{PWM}$ can be achieved by adjusting the common-mode level of the sawtooth signal $V_{SAW}$ (i.e., the mid-point of the peak-to-peak voltage of the sawtooth signal $V_{SAW}$). In a third exemplary PWM common-mode control design, the proposed common-mode control circuit 302 is configured to generate the common-mode control signal $V_{CM\_CTRL}$ to a sawtooth signal generator of the PWM circuit 104 so as to adjust the common level of the sawtooth signal (i.e., the mid-point of the peak-to-peak voltage of the sawtooth signal) for achieving PWM common-mode control.

Figure 10:
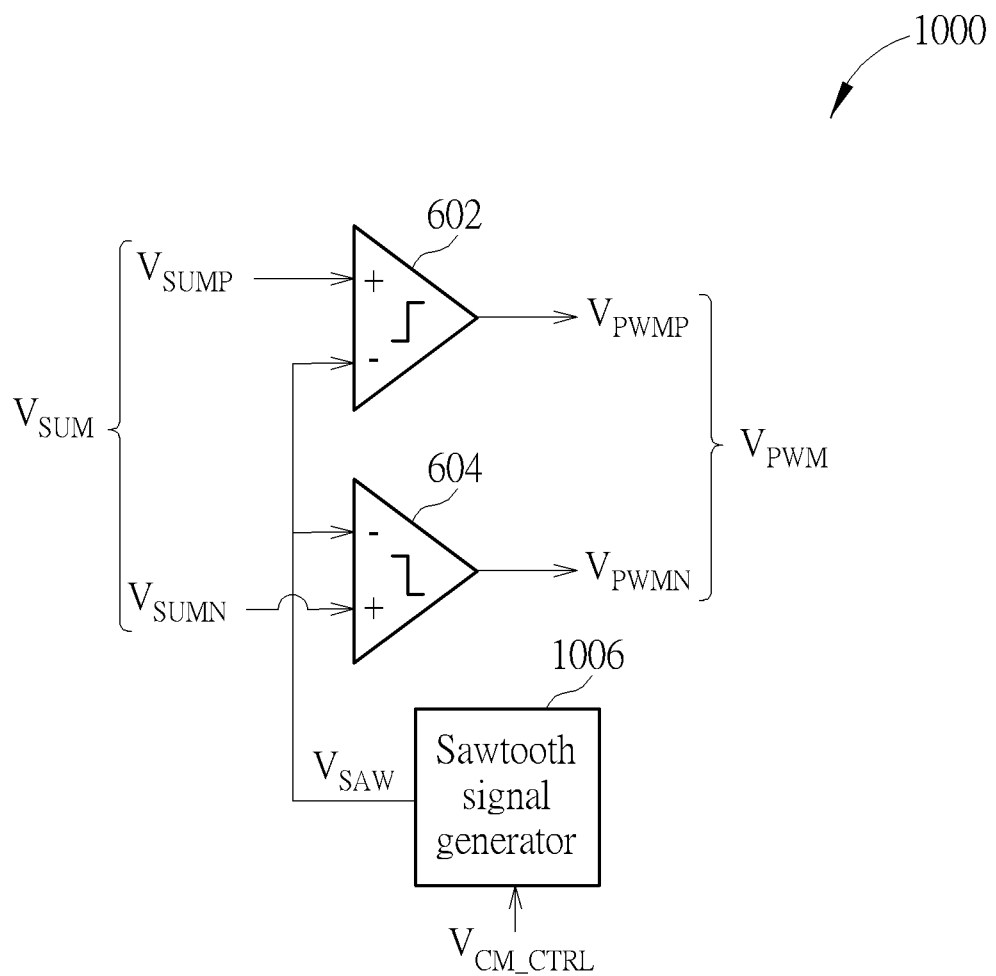
FIG. 10 is a diagram illustrating another PWM circuit according to an embodiment of the present invention.

FIG. 10 is a diagram illustrating another PWM circuit according to an embodiment of the present invention. The PWM circuit 104 shown in FIG. 3 may be implemented using the PWM circuit 1000 shown in FIG. 10. The major difference between the PWM circuits 600 and 1000 is that the PWM circuit 1000 includes a sawtooth signal generator 1006 that is responsive to the common-mode control signal $V_{CM\_CTRL}$ generated from the common-mode control circuit 302.

Figure 11:
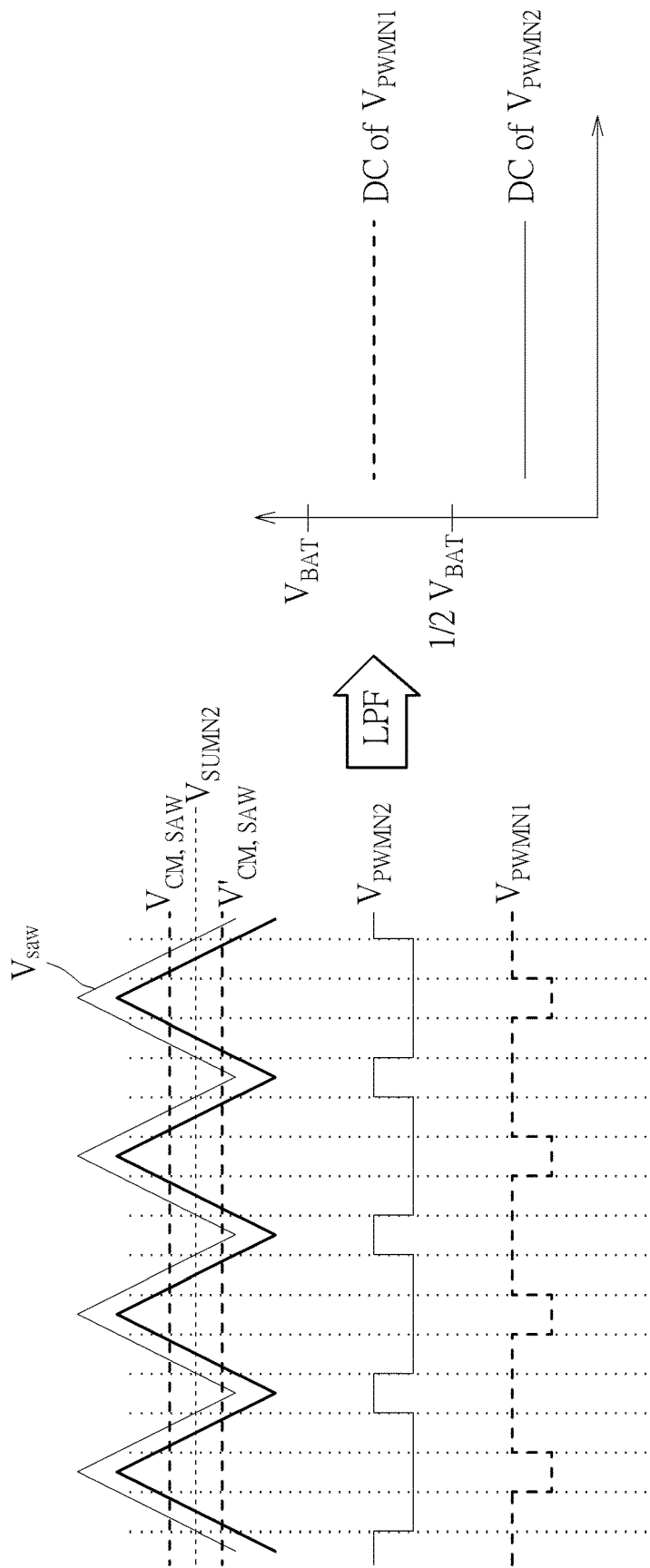
FIG. 11 is a diagram illustrating a PWM operation performed by the PWM circuit in FIG. 10 according to an embodiment of the present invention.

FIG. 11 is a diagram illustrating a PWM operation performed by the PWM circuit 1000 in FIG. 10 according to an embodiment of the present invention. Take the generation of the negative signal $V_{PWMN}$ for example. Assume that the negative signal $V_{PWMN}$ is set by a fixed voltage level $V_{SUMN2}$. In a case where the common-mode level of the sawtooth signal $V_{SAW}$ (i.e., the mid-point of the peak-to-peak voltage of the sawtooth signal $V_{SAW}$) is set by $V_{CM,SAW}$, a negative signal $V_{PWMN2}$ is generated by comparing the sawtooth signal $V_{SAW}$ with the fixed voltage level $V_{SUMN2}$. In another case where the common-mode level of the sawtooth signal $V_{SAW}$ (i.e., the mid-point of the peak-to-peak voltage of the sawtooth signal $V_{SAW}$) is set by $V'_{CM,SAW}$, a negative signal $V_{PWMN1}$ is generated by comparing the sawtooth signal $V_{SAW}$ with the fixed voltage level $V_{SUMN2}$. Since the common-mode level $V'_{CM,SAW}$ is lower than the common-mode level $V_{CM,SAW}$, the duty cycle of the negative signal $V_{PWMN1}$ is larger than the duty cycle of the negative signal $V_{PWMN2}$. Hence, the DC level of the negative signal $V_{PWMN1}$ is higher than the DC level of the negative signal $V_{PWMN2}$. As can be seen from FIG. 11, a common-mode level (DC level) of a PWM signal can be adjusted by adjusting magnitude of a sawtooth signal used for pulse-width modulation. Hence, the common-mode level (DC level) of the PWM signal $V_{PWM}$ is affected by the common-mode level of the sawtooth signal $V_{SAW}$. Based on the above observation, the sawtooth signal generator 1006 adaptively adjusts/shifts the common-mode level of the sawtooth signal $V_{SAW}$ according to the common-mode control signal $V_{CM\_CTRL}$. In this way, the common-mode level (DC level) of the PWM signal $V_{PWM}$ generated from the PWM circuit 1000 is adjusted correspondingly.

Figure 12:
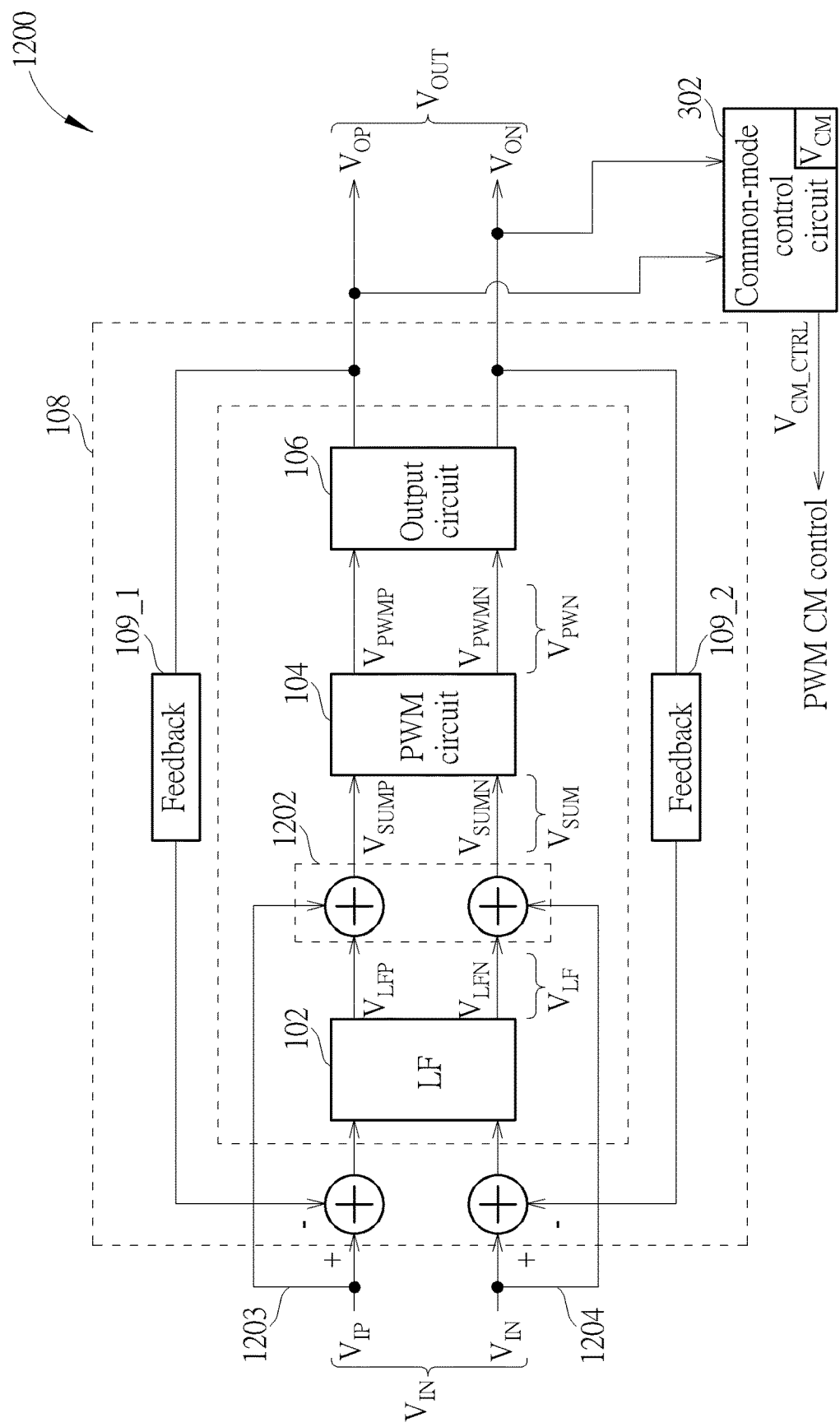
FIG. 12 is a diagram illustrating another class-D amplifier with proposed PWM common-mode control according to an embodiment of the present invention.

The class-D amplifier 300 with PWM common-mode control as illustrated in FIG. 3 is for illustrative purposes only, and is not meant to be a limitation of the present invention. For example, the class-D amplifier 300 may be modified to include input feed-forward to reduce internal swing and signal-dependent terms to further enhance the linearity. More specifically, when a class-D amplifier employs the input feed-forward, internal nodes are input signal independent, and non-linearity of the loop filter has less impact on the class-D amplifier. FIG. 12 is a diagram illustrating another class-D amplifier with proposed PWM common-mode control according to an embodiment of the present invention. The class-D amplifier 1200 may be a fully-differential closed-loop class-D amplifier, including an input feed-forward circuit (e.g., two input feed-forward paths 1203 and 1204), a combining circuit 1202, and the aforementioned common-mode control circuit 302, loop filter 102, PWM circuit 104, output circuit 106 and feedback circuit 108. That is, the class-D amplifier 1200 shown in FIG. 12 may be created by adding the input feed-forward circuit (e.g., input feed-forward paths 1203 and 1204) and the combining circuit 1202 to the class-D amplifier 300 shown in FIG. 3. In this embodiment, the input feed-forward circuit (e.g., input feed-forward paths 1203 and 1204) is arranged to feed the input signal $V_{IN}$ to the combining circuit 1202, and the combining circuit 1202 is arranged to combine the input signal $V_{IN}$ and the filtered signal $V_{LF}$ to generate the non-PWM signal $V_{SUM}$.

Figure 13:
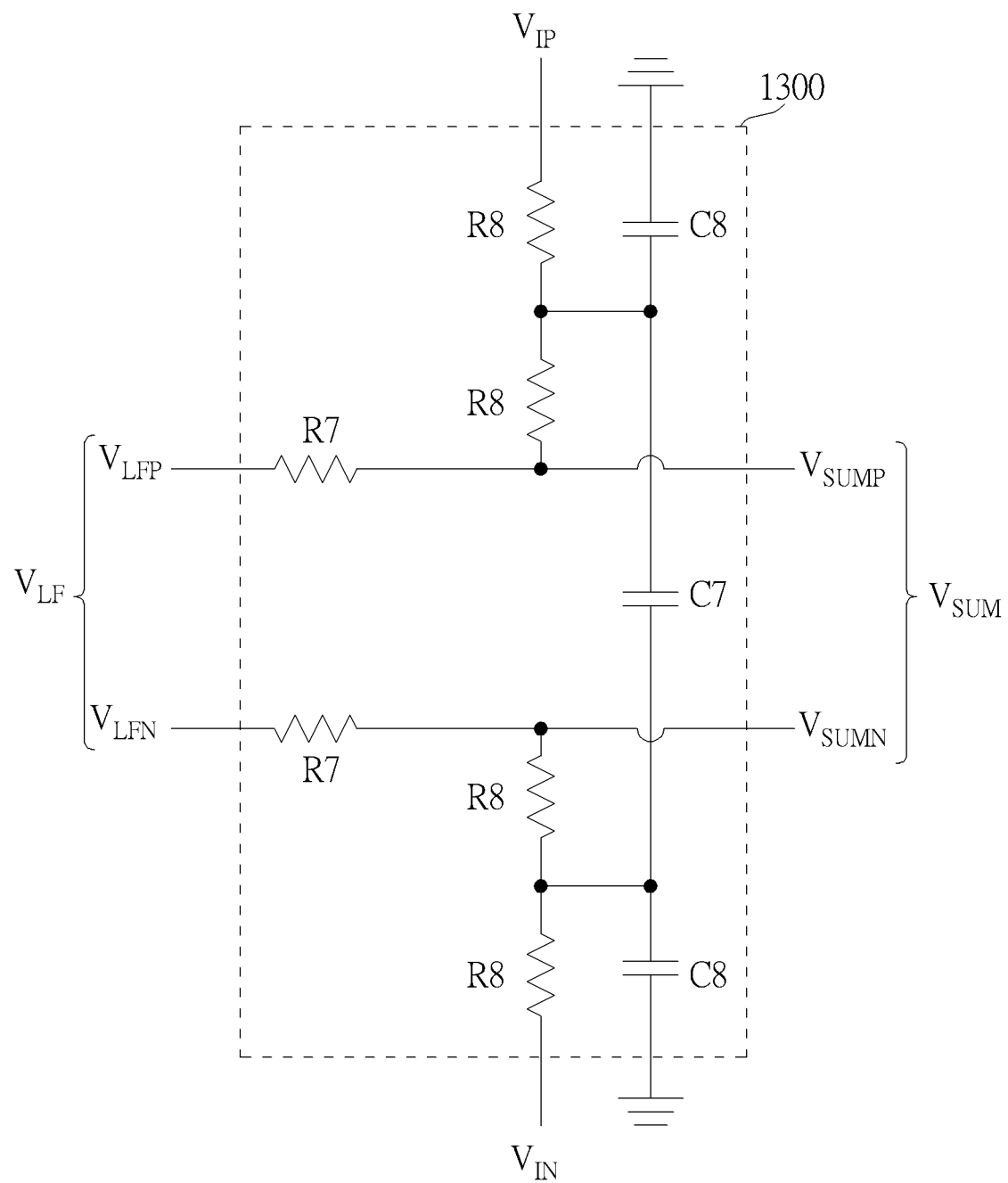
FIG. 13 is a diagram illustrating a combining circuit according to an embodiment of the present invention.

In one exemplary embodiment, the combining circuit 1202 may be composed of passive components only. Hence, input feed-forward with passive resistive summing can be realized by the combining circuit 1202. FIG. 13 is a diagram illustrating a combining circuit according to an embodiment of the present invention. The combining circuit 1202 shown in FIG. 12 may be implemented using the combining circuit 1300 shown in FIG. 13. The combining circuit 1300 only has passive components, including resistors R7, R8 and optional capacitors C7, C8. The resistors R7, R8 are used to realize the input feed-forward passive summation that combines the input signal $V_{IN}$ (which is composed of the positive signal $V_{IP}$ and the negative signal $V_{IN}$) and the filtered signal $V_{LF}$ (which is composed of the positive signal $V_{LFP}$ and the negative signal $V_{LFN}$) to generate the non-PWM signal $V_{PWM}$ (which is composed of the positive signal $V_{PWMP}$ and the negative signal $V_{PWMN}$). Since no active summing amplifier is needed by the combining circuit 1300, the power dissipation and/or the amplifier induced noise can be reduced. The capacitors C7 and C8 may be added to facilitate a low-pass function to filter out high-frequency noise along the signal path. The low-pass filter may be properly designed to reject out-of-band noise without affecting the noise transfer function (NTF) of the class-D amplifier.

Similarly, one of the aforementioned PWM common-mode control designs may be employed by the class-D amplifier 1200 for providing a common-mode gain $H_C$ to effectively suppress $\delta \times e_C$ contributed to the differential output ($V_{OP}$-$V_{ON}$). When the first exemplary PWM common-mode control design is employed, the proposed common-mode control circuit 302 is configured to generate the common-mode control signal $V_{CM\_CTRL}$ to the loop filter 102 so as to adjust the common-mode level of the filtered signal $V_{LF}$ for achieving PWM common-mode control. When the second exemplary PWM common-mode control design is employed, the proposed common-mode control circuit 302 is configured to generate the common-mode control signal $V_{CM\_CTRL}$ to a combining circuit located between the loop filter 102 and the PWM circuit 104 so as to adjust the common-mode level of the non-PWM signal $V_{SUM}$ for achieving PWM common-mode control. For example, the combining circuit 1202 may be configured to combine the input signal $V_{IN}$, the common-mode control signal $V_{CM\_CTRL}$ and the filtered signal $V_{LF}$ to generate the non-PWM signal $V_{SUM}$. However, this is for illustrative purposes only, and is not meant to be a limitation of the present invention. When the third exemplary PWM common-mode control design is employed, the proposed common-mode control circuit 302 is configured to generate the common-mode control signal $V_{CM\_CTRL}$ to a sawtooth signal generator of the PWM circuit 104 so as to adjust the common-mode level of the sawtooth signal for achieving PWM common-mode control.

In above embodiments, the proposed PWM common-mode control mechanism is applied to a fully-differential closed-loop class-D amplifier. However, these are for illustrative purposes only, and are not meant to be limitations of the present invention. Any class-D amplifier design using the proposed PWM common-mode control mechanism (which may monitor a common-mode level of a differential amplifier output to generate a common-mode control signal to an internal CMFB circuit of a loop filter, an input of a PWM circuit or an internal sawtooth signal generator of the PWM circuit) falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A class-D amplifier comprising:
a loop filter, arranged to receive an input signal of the class-D amplifier to generate a filtered signal;
a pulse-width modulation (PWM) circuit, arranged to convert a non-PWM signal into a PWM signal, wherein the non-PWM signal is derived from at least the filtered signal;
an output circuit, arranged to generate an output signal of the class-D amplifier according to the PWM signal, wherein the output signal is a fully-differential signal;
a common-mode control circuit, arranged to monitor a common-mode level of the output signal to generate a common-mode control signal for PWM common-mode control; and
a first combining circuit, located between an output of the loop filter and an input of the PWM circuit;
wherein the common-mode control circuit is arranged to output the common-mode control signal to the first combining circuit and the first combining circuit is arranged to combine the filtered signal and the common-mode control signal to adjust a common-mode level of the non-PWM signal, where the non-PWM signal is derived from combining at least the filtered signal and the common-mode control signal.

2. The class-D amplifier of claim 1, wherein the loop filter comprises a common-mode feedback (CMFB) circuit; the common-mode control circuit is arranged to output the common-mode control signal to the CMFB circuit of the loop filter; and the CMFB circuit of the loop filter is arranged to adjust a common-mode level of the filtered signal according to the common-mode control signal.

3. The class-D amplifier of claim 1, wherein the PWM circuit comprises:
a sawtooth signal generator, arranged to generate a sawtooth signal; and a comparing circuit, arranged to compare the non-PWM signal with the sawtooth signal to generate the PWM signal;

wherein the common-mode control circuit is arranged to output the common-mode control signal to the sawtooth signal generator; and the sawtooth signal generator is further arranged to adjust a common-mode level of the sawtooth signal according to the common-mode control signal.

4. The class-D amplifier of claim 1, wherein the common-mode control circuit comprises:
 a reference common-mode voltage generator, arranged to monitor a supply voltage of the class-D amplifier to generate a reference common-mode voltage; and
 an operational amplifier circuit, arranged to output the common-mode control signal according to the common-mode level of the output signal and the reference common-mode voltage.

5. The class-D amplifier of claim 4, wherein the reference common-mode voltage generator comprises a bandgap reference voltage generator arranged to provide a bandgap reference voltage, and the reference common-mode voltage is derived from the bandgap reference voltage according to the monitored supply voltage.

6. The class-D amplifier of claim 1, further comprising:
 a second combining circuit, located between an output of the loop filter and an input of the PWM circuit; and
 an input feed-forward circuit, arranged to feed the input signal to the second combining circuit;
 wherein the second combining circuit is arranged to combine at least the filtered signal and the input signal to generate the non-PWM signal, and the second combining circuit is composed of passive components only.

7. The class-D amplifier of claim 6, wherein the passive components comprise resistors arranged to perform input feed-forward resistive summation.

8. The class-D amplifier of claim 1, wherein the class-D amplifier is a fully-differential closed-loop class-D amplifier, and further comprises a feedback circuit arranged to feed back the output signal to an input of the loop filter.

9. A class-D amplifier comprising:
 a loop filter, arranged to receive an input signal of the class-D amplifier to generate a filtered signal;
 a combining circuit, arranged to combine at least the filtered signal and the input signal to generate a non-PWM signal, wherein the combining circuit is composed of passive components only;
 an input feed-forward circuit, arranged to feed the input signal to the combining circuit;
 a pulse-width modulation (PWM) circuit, arranged to convert the non-PWM signal into a PWM signal; and
 an output circuit, arranged to generate an output signal of the class-D amplifier according to the PWM signal.

10. The class-D amplifier of claim 9, wherein the passive components comprise resistors arranged to perform input feed-forward resistive summation.

11. A method for performing class-D amplification comprising:
 performing a loop filtering operation upon an input signal of the class-D amplification to generate a filtered signal;
 performing a pulse-width modulation (PWM) operation to convert a non-PWM signal into a PWM signal, wherein the non-PWM signal is derived from at least the filtered signal;

generating an output signal of the class-D amplification according to the PWM signal, wherein the output signal is a fully-differential signal; and monitoring a common-mode level of the output signal to generate a common-mode control signal for PWM common-mode control;

wherein the non-PWM signal is derived from at least the filtered signal and the common-mode control signal, and the method further comprises:
 combining the filtered signal and the common-mode control signal to adjust a common-mode level of the non-PWM signal, where the non-PWM signal is derived from combining at least the filtered signal and the common-mode control signal.

12. The method of claim 11, wherein monitoring the common-mode level of the output signal to generate the common-mode control signal for PWM common-mode control comprises:
 feeding the common-mode control signal to a common-mode feedback (CMFB) function of the loop filtering operation, wherein the CMFB function of the loop filtering operation adjusts a common-mode level of the filtered signal according to the common-mode control signal.

13. The method of claim 11, wherein the PWM operation comprises:
 generating a sawtooth signal;
 adjusting a common-mode level of the sawtooth signal according to the common-mode control signal; and
 comparing the non-PWM signal with the sawtooth signal to generate the PWM signal.

14. The method of claim 11, wherein monitoring the common-mode level of the output signal to generate the common-mode control signal for PWM common-mode control comprises:
 monitoring a supply voltage to generate a reference common-mode voltage; and
 comparing the common-mode level of the output signal with the reference common-mode voltage to output the common-mode control signal.

15. The method of claim 14, wherein monitoring the supply voltage to generate the reference common-mode voltage comprises:
 providing a bandgap reference voltage; and
 deriving the reference common-mode voltage from the bandgap reference voltage according to the monitored supply voltage.

16. The method of claim 11, further comprising:
 utilizing a combining circuit to combine at least the filtered signal and the input signal to generate the non-PWM signal;
 wherein the combining circuit is composed of passive components only.

17. The method of claim 16, wherein the passive components comprise resistors for performing input feed-forward resistive summation.

18. The method of claim 11, wherein the class-D amplification is fully-differential closed-loop class-D amplification, and the method further comprises:
 feeding back the output signal to the loop filtering operation.

19. A method for performing class-D amplification comprising:
 performing a loop filtering operation upon an input signal of the class-D amplification to generate a filtered signal;

utilizing a combining circuit to combine at least the filtered signal and the input signal to generate a non-PWM signal, wherein the combining circuit is composed of passive components only;

performing a pulse-width modulation (PWM) operation to convert the non-PWM signal into a PWM signal; and generating an output signal of the class-D amplifier according to the PWM signal.

20. The method of claim 19, wherein the passive components comprise resistors for performing input feed-forward resistive summation.

* * * * *